United States Patent [19]

Yoshihara et al.

[11] Patent Number: 4,636,908

[45] Date of Patent: Jan. 13, 1987

[54] THIN-FILM DIELECTRIC AND PROCESS FOR ITS PRODUCTION

[75] Inventors: Toshio Yoshihara, Machida; Ichiro Kikuchi, Yokohama, both of Japan

[73] Assignee: Nippon Soda Co., Ltd., Tokyo, Japan

[21] Appl. No.: 662,295

[22] PCT Filed: Jan. 31, 1984

[86] PCT No.: PCT/JP84/00027

§ 371 Date: Oct. 1, 1984

§ 102(e) Date: Oct. 1, 1984

[87] PCT Pub. No.: WO84/03003

PCT Pub. Date: Aug. 2, 1984

[30] Foreign Application Priority Data

Jan. 31, 1983 [JP] Japan .................................. 58-13869
May 31, 1983 [JP] Japan .................................. 58-94840

[51] Int. Cl.$^4$ .......................... H01G 4/10; C04B 35/46
[52] U.S. Cl. ............................. 361/321; 252/62.3 BT; 501/136
[58] Field of Search ................ 252/62.3 BT, 62.3 ZB, 252/62.3 ZT; 501/136; 361/320, 321

[56] References Cited

U.S. PATENT DOCUMENTS

| | | | |
|---|---|---|---|
| 3,495,996 | 2/1970 | Delaney et al. ................ | 501/136 X |
| 4,061,583 | 12/1977 | Murata et al. ............... | 252/62.3 BT |
| 4,063,341 | 12/1977 | Bouchard et al. .............. | 361/321 X |
| 4,266,265 | 5/1981 | Maher ............................. | 361/320 X |
| 4,309,295 | 1/1982 | McSweeney ................... | 501/136 X |

Primary Examiner—Donald A. Griffin
Attorney, Agent, or Firm—George B. Oujevolk

[57] ABSTRACT

A thin-film dielectric comprising a conductive substrate having formed thereon a thin layer of lead titanate (PT), lead titanate zirconate (PZT), third components type lead titanate zirconate prepared by adding an ingredient represented by the formula $Pb(M'_{1/3}M''_{2/3})O_3$ (wherein M' represents a divalent transition metal, and M'' represents Ta or Nb), as a third component to lead titanate zirconate (PZT) to form a solid solution, or lanthanum-containing lead titanate zirconate (PLZT). The total film thickness of the dielectric composition is 0.1 to 100 μm.

The thin-film dielectric is produced by coating the substrate with an organic solvent solution of β-diketone or the like as a precursor for said dielectric in a uniform thickness, prebaking at a temperature higher than the decomposition temperature of the organic component contained in the coating thin-film of precursor and lower than the crystallization temperature of the dielectric in an oxygen-containing stream, repeating the coating-prebaking procedure, and then fully baking at a temperature higher than the crystallization temperature of the dielectric composition; or repeating the coating with the precursor solution and the full baking procedure.

2 Claims, No Drawings

THIN-FILM DIELECTRIC AND PROCESS FOR ITS PRODUCTION

DETAILED EXPLANATION OF THE INVENTION

1. Field of the Invention

This invention concerns thin-film dielectrics. More specifically, it relates to thin-film dielectrics comprising a thin-film of lead titanate (hereunder called "PT") or lead titanate zirconate (hereunder called "PZT") or lanthanum-containing lead titanate zirconate (hereunder referred to as "PLZT") formed on a substrate and a process for production of those.

2. Background to the Invention

Conventionally, a dielectric at a thin-film state has been manufactured by grinding to a specified thickness a dielectric porcelain prepared by sintering a moulding formed through pressing a mixture of inorganic metallic compounds powder.

Under the conventional method, it is exceedingly difficult to produce a thin-film dielectric having a thicknesses of 100 microns or less and sufficiently high specific inductive capacity and satisfying requirements for excellent dielectric devices. Particularly, when very hard and highly sintered dielectric porcelain is ground to a desired thickness, crystal grain defects or cracks of thin-film easily occur, and so it becomes necessary to use a special instrument. Moreover, due to high sintering temperature, special and highly expensive metallic materials must be used as electrodes.

Processes for the production of a thin-film dielectric usable for a dielectric device have been studied by employing sputtering process, vacuum evaporation process, vapor growth process etc. In those processes, however, it is difficult for the product to obtain desired dielectric characteristics, because each vapor pressure of individual chemical component is different (for example, lead oxide has a specifically high vapor pressure to readily vaporize off) to make it difficult to control the process stoichiometrically, and further it is difficult to avoid appearing electro-conductive passage through out the thin-film (dielectric). Therefore, none of these process has been commercially adopted. In Japan Laid-Open Patent Tokkaisho 56-28408 (1981), a process for the production of thin-film dielectrics is proposed. In the process, a solution containing organo-metallic compounds is coated on a glass substrate by a dropping method or a dipping method, and the coated film is dried in air at ordinary temperature for 30 minutes and then heated at 110° C. for 30 minutes in a thermostatic oven to complete the hydrolysis reaction. Thereafter, the coated substrate is baked by heating it to a temperature in a range of 200° C.–800° C. and forcedly supplying with steam in an electric furnace.

In said method, however, a uniform coating film is not obtained because the proposed organo-metallic compounds solution is excessively unstable and readily hydrolyzed by absorbing moisture in the air. In addition, it is difficult to control the condition of atmosphere, especially, the partial vapor pressure of steam in the hydrolysis and the baking process, it is so hard to decompose and eliminate hydroxyl radicals from the baked product, because in the baking process the hydrolysis (which is a process making hydroxyl radical) is conducted simultaneously. Therefore, a practical thin-film dielectric can not be manufactured because of the frequent occurrence of electro-conductive passages through the product.

It is suggested that, in said method, it is possible to place a thin-film of dielectric material on a glass substrate, but in said publication, any of specific dielectric characteristics of the thin-films obtained is not shown, and therefore, there has been no confirmation of any success in the production of thin-film dielectric usable as dielectric devices.

In Japan Laid-open Patent Tokkaisho 58-41723 (1983) and Japan Patent Application No. Tokugansho 57-152739 (1982) filed by the applicant, the production of thin-film of dielectric on the substrate by using a dielectric precursor solution is shown, but any dielectric characteristics as the thin-film dielectric is not shown.

OBJECT OF THE INVENTION

The object of this invention is to provide a thin-film dielectric formed on a substrate having a high dielectric characteristics and being usable for dielectric devices, and to provide a process for the production thereof.

DISCLOSURE OF THE INVENTION

The present invention is a thin-film dielectric comprising two or more layers of a thin-film of a dielectric formed on a substrate, the composition of said dielectric is selected from a group consisting of the following (a), (b), (c) and (d):

(a) lead titanate (PT) represented by the formula (1)

$$PbTiO_3 \tag{1}$$

(b) lead titanate zirconate (PZT) represented by the formula (2)

$$PbTi_xZr_yO_3 \tag{2}$$

(wherein, x and y represent figures satisfying the following relations;
x is 0.3 to 0.55,
y is 0.45 to 0.7, and
$x+y=1$)

(c) lead titanate zirconate containing third components (third components type PZT) represented by the formula (3)

$$Pb(Ti_xZr_y)_s(M'_{\frac{1}{3}}M''_{\frac{2}{3}})_tO_3 \tag{3}$$

(wherein,
M' represents a divalent metal selected from a group consisting of Mg, Co, Fe, Cr, Zn, Mn, Ni and Cd,
M" represents Nb or Ta,
x and y represent figures satisfying the following relations;
x is 0.3 to 0.55,
y is 0.45 to 0.7, and
$x+y=1$,
s and t represent figures satisfying the following relations;
$s+t=1$ and
$b \leq 0.6$)

(d) lead titanate zirconate containing lanthanum (PLZT) represented by the formula (4)

$$Pb_{(1-z)}La_zM_{(1-(z/4))}O_3 \tag{4}$$

(wherein, M represents a mixture of Ti and Zr, and z represents figures satisfying the relation of $Z \leq 0.2$);

and a process for the production of thin-film dielectric comprising forming on a substrate a thin-film of a dielectric precursor selected from a group consisting of a mixture or a reaction product of organo-titanium compounds and lead compounds;

a mixture or a reaction product of organo-titanium compounds, organo-zirconium compounds and lead compounds;

a mixture or a reaction product or organo-titanium compounds, organo-zirconium compounds, lead compounds, tantalum or niobium compounds and one kind of metallic compounds selected from a group consisting of magnesium compounds, cobalt compounds, iron compounds, chromium compounds, zinc compounds, manganese compounds, nickel compounds and cadmium compounds; and a mixture or a reaction product of lanthanum compounds, organo-titanium compounds, organo-zirconium compounds and lead compounds, by coating on the substrate a solution of said dielectric precursor in an organic or a mixed organic solvent mainly containing one, two or more of β-diketones, ketoacids, ketoesters, oxyacids, oxyesters, oxyketones etc., and then drying, thereafter, pre-baking said thin-film of dielectric precursor at a temperature between the decomposing temperature of organic component of said precursor and the crystallizing temperature of the objective dielectric, then, repeating the cycle of said coating of said precursor solution and said drying of the coated filmlayer of said precursor and said pre-baking, and finally, full-baking the pre-baked coated film layers on the substrate at a temperature of the crystallizing temperature of the dielectric or higher;

or comprising repeating the cycle of said coating of said precursor solution and said drying to form the coated film layer of said precursor and said full-baking of said thin-film of dielectric precursor at a temperature of the crystallizing temperature of the dielectric or higher.

The substrate used for the thin-film dielectric of this invention is a heat resistant substrate, for examples, glass plate; ceramic plate; glass or ceramic plates coated by an electro-conductive thin-film usable as an electrode such as a metal or alloy of gold, platinium, palladium silver, copper, chromium, aluminium, tantalum, nickel-chromium or the like, formula (5):

$$M(OR)_4 \quad (5)$$

(wherein,

M represents Ti or Zr, and

R represents same or different monovalent hydrocarbon radicals);

polymers of said metal oxide having a polymerization degree of 2 to 20, which are produced by polycondensation through hydrolysis of said metal alkoxides and have the repeating unit having the following formula (6):

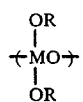

$$\begin{array}{c} \text{OR} \\ | \\ \text{+MO+} \\ | \\ \text{OR} \end{array} \quad (6)$$

(wherein, M and R means the same as the above);

and chelate compounds substituting part(s) or all of alkoxy radicals of said metal alkoxides or said polymers with the residue of a chelating agent having two functional radical(s) are proposed.

As the organo-titanium compounds usable herein, they are enumerated as below: Tetramethyl titanate, tetraethyl titanate, tetraisopropyl titanate, tetrabutyl titanate, dimethyl-diisopropyl titanate, diethyl-diisopropyl titanate, diethyl-dibutyl titanate and other titanium alkoxides having same or different substituents; polymers produced by hydrolyzing such titanium alkoxides; and compounds substituting part(s) or all of alkoxy radicals of said alkoxides or their polymers by the residue of chelating agents having two functional radical(s), for examples, β-diketones such as acetylacetone, benzoylacetone or the like; ketoacids such as acetoacetic acid, propionylbutyric acid, benzoylformic acid or the like; lower alkyl esters of ketoacids having an alkyl radical such as methyl, ethyl, propyl, butyl or the like; oxyacids such as lactic acid, glycolic acid, α-oxybutyric acid, salicylic acid or the like; lower alkyl esters of oxyacids; oxyketones such as diacetone alcohol, acetoin or the like; α-amino acids such as glycine, alanine or the like and amino alcohols such as aminoethyl alcohol or the like. As the organo-zirconium compounds usable herein, zirconium alkoxides having similar substituents to those shown in the above organo-titanium compounds; polymers obtained from said zirconium alkoxides; and compounds substituted part(s) or all of the alkoxy radicals of zirconium alkoxides or their polymers by the residue of said chelating agents having two functional radicals are examplified.

For tantalum compounds and niobium compounds, their alkoxides having similar substituents to those in the aforesaid organo-titanium compounds; and compounds obtained by substituting part(s) or all of the alkoxy radicals of said alkoxides by the residue of said chelating agent having two functional radicals. As magnesium compounds, cobalt compounds, iron compounds, chromium compounds, zinc compounds, manganese compounds, nickel compounds, cadmium compounds, lanthanum compounds and lead compounds, their inorganic salts such as oxides, hydroxides, nitrates and the like; their carboxylic acid salts such as acetates, propionates, butyrates and the like; and their alkoxides etc. are used.

In the process for the production of the thin-film dielectric of the invention, the dielectric precursor solution is a solution of a mixtures or a reaction product of two or more of aforesaid metallic compounds in the aforesaid organic solvent to be a concentration from 5 to 20 weight percent (% wt) in terms of the complex oxide (dielectric).

In the process for the production of the thin-film dielectric of the invention, the number of times to be repeat the cycle of the coating of the aforementioned dielectric precursor solution on the substrate, drying and pre-baking or full-baking is at least two and desirably three or more. Further, under the process for the production of the thin-film dielectric, the pre-baking temperature is in a range from 200° to 500° C., depending on the kinds of metallic compounds and the kinds of organic solvents used for the preparation of the precursor solution and the full-baking temperature is usually 450° C. or more, depending on the kind of dielectrics.

THE BEST MODE OF OPERATION OF THE INVENTION

The thin-film dielectric of the invention is exceedingly thin and transparent dielectrics having total film thickness in a range from 0.1 to 100 μm formed by laminating dielectric composition on the substrate in two or more thin-film layers. This thin-film dielectric has remarkably excellent dielectric characteristics equal to or higher than those of dielectric porcelain of the same dielectric composition.

When the total film thickness of the dielectric is thinner than 0.1 μm, electrical conduction through the layer is cannot be avoided, and even if there could become no electro-conductive passage, the durability as a dielectric is undesirably too short. In the event that it exceeds 100 μm, there is no problem for the quality in particular, but under industrial consideration, it is advisable that the film thickness should be in a range from 0.5 to 50 μm.

Concerning the number of the coated film layers of dielectric, increasing of the layers provides electro-conductive passage-free thin-film dielectrics, since increased film layers repair each other pinholes, intergranular cracks and other film defects by cancelling or compensating such defect to produce a thin-film dielectric having no electro-conductive passage. Accordingly, the number of thin-film layers by which a dielectric is composed should desirably be not less than three, and more desirably, not less than five.

For example, as shown in the Examples of this invention given later, PT thin-film dielectric having six thin-film layers and a total film thickness of 1.3 μm, has dielectric characteristics as follows: Electrostatic capacity: $C = 0.18$ $\mu F/cm^2$, dielectric loss: tan $\delta = 0.04$, specific resistance: $4 \times 10^{12}$ $\Omega cm$, specific inductive capacity: $\epsilon = 270$.

And PZT thin-film dielectric having seven thin-film layers and a total film thickness of 0.8 μm has the following dielectric characteristics: Electrostatic capacity: $C = 0.80$ $\mu F/cm^2$, dielectric loss: tan $\delta = 0.08$, specific resistance: $2 \times 10^{12}$ $\Omega cm$, specific inductive capacity: $\epsilon = 720$. The thin-film dielectric of the invention can be produced by either of two methods shown herein.

One of the aforementioned dielectric precursor solutions is coated on any of aforesaid substrates and is dried to form a coating thin-film of said dielectric precursor at an even thickness. Thereafter, in an oxygen-containing gas stream, the thin-film precursor laying on the substrate is pre-baked by holding it at a temperature range between the decomposing temperature of the organic component in said coating film and the crystallizing temperature of the dielectric to be produced. The cycle of such coating, drying and pre-baking is repeated to form a desirable thickness of thin-film dielectric precursor pre-baked. When this is accomplished, said pre-baked film is finally subjected to full-baking at a temperature of the crystallizing temperature of the dielectric or higher. Thus, the thin-film dielectric with desirable film thickness is produced.

The thin-film dielectric having desirable film thickness can also be obtained by repeating a cycle of coating, drying and full-baking. However, the former approach is advisable in view of the absense of defects, because said process makes less pinholes, cracks or the like defects. As to the coating method of the dielectric precursor solution on the substrate, any method obtainable a coating film having an uniform thickness such as the dipping method, spray method, spinner method, roll-coat method, brushing method or the like can be used. The dipping method is preferably adopted, because the coating film at a uniform thickness can be easily obtained through a simple operation and it is suitable to a large quantity treatment. More preferably used is a process so called the "hot dipping method", in which the homogeneity and uniform thickness of the coating film are ensured through dipping of a mildly preheated substrate in a bath of precursor solution heated and maintained at a temperature from 40° to 95° C.

The number of times repeating the cycle of coating of the dielectric precursor solution on the substrate, drying after coating, and pre-baking or full-baking should be at least two times and desirably three times or more, still more desirably five times or more, in order to eliminate the electro-conductive passage caused by the defects of pinholes, cracks or the like from the thin-film dielectric product. Too few frequency of the cycle of the repetition is avoided considering its likely failure to eliminate the electro-conductive passage through the thin-film layers of the dielectric.

For the dielectric precursor solution, a single solvent comprising one of the aforementioned organic solvents or a mixed solvent mainly containing two or more of those solvent are used. In those organic solvents, the solubility of the dielectric precursor is so high that a solution of the precursor at a high concentration can be obtained. The organic solvent forms a chelate ring with the metal atoms in said precursor solution to uniformly disperse or dissolve the metallic compounds therein and stabilize said precursor solution and prevent precipitating by hydrolysis. In addition, the precursor solution using such organic solvents marvellously excels the formability of thin-film of the dielectric precursor on the substrate, especially on metallic substrate. At baking, hydroxyl radicals in or on the film are completely decomposed without any remaining, so that electro-conductive passage caused by remaining hydroxyl radicals can be prevented. As organic solvents, β-diketones particularly acetylacetone are preferably used, on account of their ready availability and reasonable price.

When the concentration of the dielectric precursor solution is too low, the thickness of the film formed by one coating-drying-baking cycle becomes so thin that the repeating times of the coating-drying-baking cycle becomes undesirably too many to obtain a suitable thickness of a thin-film dielectric.

Conversely, if said concentration is too high, the thickness of the coating film formed by one coating of the precursor solution becomes too thick, and on baking, the film defects of pinholes, cracks or the like undesirably easily appear.

Though it varies with the coating method employed, the concentration of the dielectric precursor solution should be in a range from 5 to 20 weight percent in terms of the complex oxide of metals (dielectric composition).

The processes for producing the thin-film dielectric having each different dielectric composition are explained more in detail as follows:

THIN-FILM DIELECTRICS OF PT

As the dielectric precursor solution, a solution of a mixture or a reaction product of an organic titanium compound and lead compound in aforesaid organic solvent(s), desirably a solution of said reaction product of those in β-diketone, and more desirably, an acetylacetone solution of the reaction product, which is disclosed by the Applicant in Japan Laid-Open Patent Tokkaisho 58-41723 (1983) and can be obtained by a reaction of a titanium alkoxide and a lead carboxylic acid salt and is represented by the following formula (7) are employed.

$$PbTiO_2(OR)_j(OCOR')_k \quad (7)$$

(wherein R and R' represent same or different monovalent hydrocarbon radicals, and j and k represent figures satisfying the relation of j+k=2)

In the bath of the said precursor solution kept at a temperature from 40° to 95° C., preferably from 40° to 50° C., a substrate preheated at almost the same level of temperature as the bath is submerged and the substrate is pull up at a constant rate from the bath and is dried to form a coating film of dielectric precursor. Then, said substrate is pre-baked by heating and holding it in the air at a temperature in a range of 200° to 450° C., desirably 350° to 450° C., to form thin-film pre-baked.

Such coated substrate is further subjected to repeating cycles of precursor solution coating, drying and pre-baking until an intended thickness of the thin-film layers is obtained. Such coated substrate is further full-baked by heating at a temperature of 450° C. or more, desirably in a range of 450°-750° C. Thus a desired thickness of thin-film of PT is formed on the substrate and a intended thin-film dielectric of PT is produced.

THIN-FILM DIELECTRICS OF PZT

As the dielectric precursor solution used for this case is a solution of a mixture or reaction product with organic titanium compounds, organic zirconium compounds and lead compounds in said organic solvent, desirably a β-diketone solution of said reaction product, more desirably an acetylacetone solution of the reaction product in which Ti in the above chemical formula (7) is replaced by a mixture of Ti and Zr and the Ti/Zr atom ratio is adjusted to 0.3-0.55/0.7-0.45. Using said precursor solution and according to the almost same method as those in the case of said thin-film dielectric of PT, the product thin-film dielectric of PZT is produced. In the case of PZT dielectric, the pre-baking temperature is in a range from 200° to 500° C., desirably in a range from 400° to 500° C., and the full-baking temperature is 500° C. or more, desirably in a range from 500° to 700° C., though it is different depending on the atomic ratio of Ti and Zr.

THIN-FILM DIELECTRICS OF THIRD-COMPONENTS TYPE PZT

As the dielectric precursor solution used for this case is a solution of a mixture or reaction product prepared by adding one kind of compounds selected from a group consisting of magnesium compounds, cobalt compounds, iron compounds, chromium compounds, zinc compounds, manganese compounds, nickel compounds and cadmium compounds; and tantalum compounds or niobium compounds to said PZT dielectric precursor solution to be mixed or reacted, more preferably an acetylacetone solution of the reaction product disclosed by the Applicant in Japan Patent Application Tokugansho 57-152739 (1982) and shown by the following formula (8):

$$PbM_s(M'_{\frac{1}{3}}M''_{\frac{2}{3}})_tO_2(OR)_j(OCOR')_k \quad (8)$$

(wherein
M represents a mixture of Ti and Zr in which atom ratio Ti/Zr is adjusted to 0.3-0.55/0.7-0.45, and
M' represents a divalent metal selected from a group consisting of Mg, Co, Fe, Cr, Zn, Mn, Ni and Cd, and
M" represents Nb or Ta, and
S and t represent figures satisfying the following relations: s+t=1 and t≦0.6, and
R, R' j and k have the same meanings defined in the formula (7) respectively.)

Using such precursor solution, and according to the almost same method of production as those in the case of said thin-film dielectric of PT, the third-components type PZT thin-film dielectric is produced. The pre-baking temperature for the third-component-type dielectric of PZT ranges between 200° and 500° C., desirably between 400° and 500° C., and the full-baking temperature is 600° C. or higher preferably from 600° to 800° C., though it depends on the atomic ratio of the metals.

THIN-FILM DIELECTRICS OF PLZT

As the dielectric precursor solution, used herein is a solution of a mixture or a reaction product of organic titanium compounds, organic zirconium compounds, lanthanum compounds and lead compounds in said organic solvents, preferably β-diketone solution of the reaction product, more preferably an acetylacetone solution of the reaction product disclosed by the Applicant in Japan Patent Application Tokugansho No. 57-152739 (1982) and shown as the following formula (9):

$$Pb_{(1-z)}La_zM_{(1-(z/4))}O_2(OR)_j(OCOR')_k \quad (9)$$

(wherein M, R, R', z, j and k mean the same as defined before) Using said precursor solution, according to the almost same method of production as those in the case of said thin-film dielectric of PT, the thin-film dielectric of PLZT is produced. In the case of PLZT dielectrics, the pre-baking temprature is in a range from 200° to 500° C., desirably from 400° to 500° C., whilst the full-baking temperature is in a range from 600° to 800° C., though it depends on the atomic ratio of the metals.

In the following, better modes of the operation of the invention are explained more in detail by using examples of the invention and the comparative examples. The examples of the invention given below, however, in no way limit the scope of this invention.

EXAMPLE 1

Thin-film Dielectric of PT and its Production
Preparation of the Dielectric Precursor Solution Tetrabutyl titanate Ti(OC4H9)4 and lead acetate Pb(CH3COO)2 were weighed out to make the Ti/Pb atom ratio just 1, then they were reacted in paraxylene 200 ml by heating at 130°-140° C. Under reduced pressure, substances of low boiling points were distilled off, and powdery reaction product was obtained as the residue.

The reaction product thus obtained was then heated to 500° C. to be thermally decomposed. As the results of X-ray diffractometry, it was confirmed that the thermally decomposed product was tetragonal crystals of PbTiO3.

By dissolving the powdery reaction product obtained in the above reaction, which was analitically confirmed as $PbTIO_2(OC_4H_9)_{1.4}(OCOCH_3)_{0.6}$, into acetylacetone, the PT dielectric precursor solution having 14 wt% concentration in terms of $PbTiO_3$ was prepared.

Production of the Thin-film Dielectric of PT

PT dielectric precursor solution prepared in above was poured into a bath and heated at 40°–50° C. A glass substrate coated with a tin-bearing indium oxide film (ITO film) having a sige of 100 mm×50 mm×1 mm was heated to 50° C. and immersed in this solution, then the substrate was pulled up at a constant rate of 30 cm/min and dried. A coating film of the PT dielectric precursor was formed. Then the coated substrate was full-baked by keeping it for 30 minutes in an electric furnace heated at 500° C. A thin-film of PT dielectric was formed.

Cycle of the dipping of the substrate in the PT dielectric precursor solution and the full-baking were repeated, and the transparent thin-film PT dielectric were obtained. As the results of X-ray diffractometry, it was confirmed that the obtained PT dielectric thin-film is tetragonal crystalline $PbTiO_3$, the crystal axes of which were oriented to the same directions.

Measurement of Dielectric Characteristics

A thin gold film of 1 cm×1 cm was formed by sputtering method on the surface of the thin-film PT dielectric obtained, then a silver paste was coated on it to serve as an electrode. 0.1 KHz alternating current was charged between this electrode and the ITO film on the substrate to measure the dielectric properties.

Table 1 shows the repeated number of cycles of the dipping of the substrate to the precursor solution and the full-baking of the coated substrate, and the results of the measurement of their dielectric characteristics.

TABLE 1

|  |  | Sample number | | |
|---|---|---|---|---|
|  |  | 1-1 | 1-2 | 1-3 |
| Dipping frequency | n (times) | 6 | 8 | 10 |
| Film thickness | d (μm) | 1.3 | 1.8 | 2.2 |
| Electrostatic capacity | C (μF/cm²) | 0.18 | 0.12 | 0.10 |
| Dielectric loss | tan δ | 0.04 | 0.04 | 0.05 |
| Specific resistance | (Ωcm) | $4 \times 10^{12}$ | $3 \times 10^{12}$ | $4 \times 10^{12}$ |
| Specific induction capactity | ε | 270 | 250 | 250 |

EXAMPLE 2

Thin-film Dielectric of PZT and its Production

Lead oxide PbO, zirconium acetylacetonato $Zr(CH_3COCHCOCH_3)_4$ and tetrabutyl titanate $Ti(OC_4H_9)_4$ were weighed out to make the molar ratio of $PbTiO_3/PbZrO_3$ become 45/55, then they were reacted in acetylacetone to produce the PZT precursor dielectric solution at 12.5 wt% concentration in terms of $Pb(Ti_{0.45}Zr_{0.55})O_3$ was prepared.

The PZT dielectric precursor solution was heated to distill off the solvent. The residue was thermally decomposed at 500° C., and yellow powder was obtained, and it was confirmed as crystals of PZT by X-ray diffractometry.

A glass substrate coated with the same ITO film and having the same dimension as used in Example 1 was dipped in the PZT dielectric precursor solution, and the substrate was pulled up at a constant rate of 47 cm/min. The procedures of all other treatments were conducted as same as Example 1, and obtained thin-film dielectric on the substrate. As the results of X-ray diffractometry of the thin-film, it was confirmed that the thin-film is made of PZT.

The results of the measurement of their dielectric characteristics obtained in the same manner as shown in Example 1 are shown in Table 2.

TABLE 2

|  |  | Sample number | | |
|---|---|---|---|---|
|  |  | 2-1 | 2-2 | 2-3 |
| Dipping frequency | n (times) | 5 | 7 | 10 |
| Film thickness | d (μm) | 0.6 | 0.8 | 1.1 |
| Electrostatic capacity | C (μF/cm²) | 0.99 | 0.80 | 0.54 |
| Dielectric loss | tan δ | 0.09 | 0.08 | 0.06 |
| Specific resistance | (Ωcm) | $2 \times 10^{12}$ | $2 \times 10^{12}$ | $1 \times 10^{12}$ |
| Specific induction capacity | ε | 670 | 720 | 670 |

EXAMPLE 3

Thin-film Dielectric of PLZT and its Production

Into a 200 ml four-mouthed flask mounted with a thermometer, a reflux condenser and a stirrer, 14.85 g (45.3 mmol) of lead acetate ($Pb(CH_3COO)_2$ of 99.1 wt% purity), 1.57 g (4.8 mmol) of lanthanum acetate ($La(CH_3COO)_3$ of 95.6 wt% purity), 14.40 g (32.5 mmol) of tetrabutyl zirconate ($Zr(OC_4H_9)_4$ of 86.6 wt% purity), 6.02 g (17.5 mmol) of tetrabutyl titanate ($Ti(OC_4H_9)_4$ of 99 wt% purity) and 37 g of xylene were fed, and the contents were mixed and heated up in nitrogen atmosphere under stirring. At a reaction temperature of 130° C. or so, distillation of butanol and butylacetate began, and the white-cloudy reaction mixture changed to a yellowish brown and evenly transparent solution.

Under reduced pressure, approximately 25 g of xylene was distilled off from the solution. Then approximately 100 g of acetylacetone was added thereto and heated under reflux, and the PLZT dielectric precursor solution in a concentration of 10 wt% in terms of $Pb_{0.905}La_{0.095}(Zr_{0.65}Ti_{0.35})O_3$ was prepared.

A platinum substrate of 30 mm×50 mm×1.2 mm preheated at 60° C. was immersed in the PLZT dielectric precursor solution held at 60°–70° C., and then pulled up at a constant rate of 47 cm/min and dried, and a coating film of said precursor formed on it. The film coated substrate was pre-baked for 30 minutes in an electric furnace heated at 500° C. The dipping of the substrate in the precursor solution and the pre-baking were repeated, and then thus coated substrate was full-baked for 30 minutes in an electric furnace heated at 750° C. to crystallize the thin-film.

As the results of X-ray diffractometry of the obtained thin-film, it was confirmed that the thin-film was made of PLZT.

Table 3 shows the dielectric characteristics of the thin-film dielectric of PLZT thus obtained by measuring in the same manner as shown in Example 1.

TABLE 3

|  |  | Sample number | | |
|---|---|---|---|---|
|  |  | 3-1 | 3-2 | 3-3 |
| Dipping frequency | n (times) | 7 | 13 | 20 |
| Film thickness | d (μm) | 0.8 | 1.64 | 2.5 |
| Electrostatic | C (μF/cm²) | 0.89 | 0.51 | 0.35 |

TABLE 3-continued

|  |  | Sample number | | |
|---|---|---|---|---|
|  |  | 3-1 | 3-2 | 3-3 |
| capacity |  |  |  |  |
| Dielectric loss | tan δ | 0.10 | 0.09 | 0.05 |
| Specific resistance | (Ωcm) | $3 \times 10^{12}$ | $2 \times 10^{12}$ | $2 \times 10^{12}$ |
| Specific induction capacity | ε | 804 | 944 | 988 |

EXAMPLE 4

Thin-film Dielectric of Third-components Type PZT and its Production

Into the same reaction vessel as used in Example 3, 16.4 g (50 mmol) of lead acetate ($Pb(CH_3COO)_2$ of 99.1 wt% purity), 3.0 g (6.8 mmol) of tetrabutyl zirconate ($Zr(OC_4H_9)_4$ of 86.6 wt% purity), 6.3 g (18.3 mmol) of tetrabutyl titanate ($Ti(OC_4H_9)_4$ of 99 wt% purity), 1.2 g (8.3 mmol) of magnesium acetate ($Mg(CH_3COO)_2$ of 99 wt% purity), 7.6 g (16.7 mmol) of pentabutyl niobate ($Nb(OC_4H_9)_5$ of 99.99 wt% purity) and 30 g of xylene were introduced and heated in nitrogen atmosphere under stirring.

At a reaction temperature of 130° C. or so, distillation of butanol and butyl-acetate began, and the white-cloudy reaction mixture changed to a yellowish brown uniformly transparent solution. Under reduced pressure, approximately 10 g of xylene was distilled off from the solution, then approximately 100 g of acetylacetone was added thereto and heated under reflux, and the third-components type PZT dielectric precursor solution in a concentration of 10 wt% in terms of $0.135PbZrO_3\text{-}0.365PbTiO_3\text{-}0.500Pb(Mg_{\frac{1}{3}}Nb_{\frac{2}{3}})O_3$ was prepared.

A platinum substrate of 30 mm×50 mm×0.2 mm preheated at 60° C. was dipped in the third-component type PZT dielectric precursor solution at 60°-70° C., and then pulled up at a constant rate of 47 cm/min and dried, to form a coating film of said precursor thereon. The film coated substrate was pre-baked for 30 minutes in an electric furnace heated at 500° C. The dipping of the substrate in the precursor solution and its pre-baking were repeated, and then thus coated substrate was full-baked for 30 minutes in an electric furnace heated at 700° C. to crystallize the thi-film.

As the results of X-ray diffractometry of the obtained thin-film, it was confirmed that the thin-film was third-components type PZT dielectric of $0.135PbZrO_3\text{-}0.365PbTiO_3\text{-}0.5000Pb(Mg_{\frac{1}{3}}Nb_{\frac{2}{3}})O_3$ composition.

The dielectric characteristics of the obtained thin-film dielectric of three-component type PZT obtained by the measurement in accordance with the same method as shown in Example 1 are shown in Table 4.

TABLE 4

|  |  | Sample number | | |
|---|---|---|---|---|
|  |  | 4-1 | 4-2 | 4-3 |
| Dipping frequency | n (times) | 6 | 13 | 20 |
| Film thickness | d (μm) | 0.81 | 1.72 | 2.65 |
| Electrostatic capacity | C (μF/cm²) | 0.35 | 0.21 | 0.13 |
| Dielectric loss | tan δ | 0.07 | 0.06 | 0.03 |
| Specific resistance | (Ωcm) | $3 \times 10^{12}$ | $2 \times 10^{12}$ | $1 \times 10^{12}$ |
| Specific induction capacity | ε | 320 | 408 | 389 |

EXAMPLE 5

Thin-film Dielectric of Three-component Type PZT and its Production

Into the same reaction vessel as used in Example 3, 16.4 g (50 mmol) of lead acetate ($Pb(CH_3COO)_2$ of 99.1 wt% purity), 3.3 g (7.5 mmol) of tetrabutyl zirconate ($Zr(OC_4H_9)_4$ of 86.6 wt% purity), 6.0 g (17.5 mmol) of tetrabutyl titanate ($Ti(OC_4H_9)_4$ of 99 wt% purity), 3.0 g (16.7 mmol) of nickel acetate ($Ni(CH_3COO)_2$ of 98.2 wt% purity), 15.2 g (33.3 mmol) of pentabutyl niobate ($Nb(OC_4H_9)_5$ of 99.99 wt% purity) and 30 g of xylene were introduced and heated with stirring in a nitrogen atmosphere.

At a reaction temperature of 130° C. or so, distillation of butanol and butyl-acetate began. The white-cloudy reaction mixture changed to a yellowish brown uniformly transparent solution. Approximately 150 g of acetylacetone added to said reaction solution was then heated under reflux, and the third-components type PZT dielectric precursor solution at a concentration of 10 wt% in terms of $0.15PbZrO_3\text{-}0.35PbTiO_3\text{-}0.55Pb(Ni_{\frac{1}{3}}Nb_{\frac{2}{3}})O_3$ was prepared.

A platinum substrate of 30 mm×50 mm×0.2 mm preheated at 60° C. was dipped in the third-component type PZT dielectric precursor solution kept at 60°-70° C., and then pulled up at a constant rate of 47 cm/min and aried, to form a coating film of said precursor thereon. The film coated substrate was pre-baked for 30 minutes in an electric furnace at 500° C. The dipping in the precursor solution and the pre-baking were repeated at desired times, and then thus coated substrate was full-baked for 30 minute in an electric furnace heated at 700° C. to crystallize the thin-film.

As the results of X-ray diffractometry, it was confirmed that the thin-film was third-components type PZT dielectric of $0.15PbZrO_3\text{-}0.35PbTiO_3\text{-}0.55Pb(Ni_{\frac{1}{3}}Nb_{\frac{2}{3}})O_3$ composition.

The dielectric characteristics of the obtained thin-film dielectic of third-components type PZT dielectric obtained by the measurement in accordance with the same method as shown in Example 1, are shown in Table 5.

TABLE 5

|  |  | Sample number | | |
|---|---|---|---|---|
|  |  | 5-1 | 5-2 | 5-3 |
| Dipping frequency | n (times) | 6 | 13 | 20 |
| Film thickness | d (μm) | 0.87 | 1.85 | 2.8 |
| Electrostatic capacity | C (μF/cm²) | 0.67 | 0.31 | 0.22 |
| Dielectric loss | tan δ | 0.13 | 0.05 | 0.04 |
| Specific resistance | (Ωcm) | $2 \times 10^{12}$ | $2 \times 10^{12}$ | $2 \times 10^{12}$ |
| Specific induction capacity | ε | 658 | 648 | 696 |

EXAMPLE 6-10

Varieties of thin-film dielectrics were prepared by changing the kind of used metal compounds as raw materials for the dielectric precursor solution, the types of the substrates, and other relevant conditions.

Those various conditions and the dielectric characteristics of the obtained thin-film dielectrics are shown in Table 6.

For reference, the properties of the dielectric obtained by one cycle of dipping and full-baking were measured and given in Table 6.

COMPARATIVE EXAMPLES 1-5

The solvent of the dielectric precursor solution as used in Example 1-5 was changed to an alcohol-type solvent.

Using such alcoholic precursor solution, thin-film dielectrics were made under the same conditions as those described in the above Examples.

The dielectric characteristics of the obtained thin-film dielectrics were measured in accordance with the same method as described in Example 1.

As shown in Table 6, all those dielectrics have electro-conductive passages and were useless as thin-film dielectric.

since the compositionally uniform dielectric precursor solution is used, the stoichiometric control throughout the process is conducted very correctly and easily and the thin dielectric films obtained have a complete uniformity in the chemical composition, and because these thin-film defects in the individual film are compensatedly repaired to finally make the films or non-electroconductive passage.

Further, the high dielectric characteristics suggests a specified direction in which the crystal axes of the film dielectric are orientated in certain directions in a good state.

In addition, since the aforesaid organic solvents are used as the solvent for the dielectric precursor solution,

TABLE 6

| No. of Examples and Comparative Examples | Dielectrics precursor solution | | | Dipping frequency n (times) | Pre-baking temperature °C. | Full-baking temperature °C. | Film thickness d μm | Electrostatic capacity C μF/cm$^2$ | Dielectric loss tan δ | Specific resistance Ω cm | Specific induction capacity ε |
|---|---|---|---|---|---|---|---|---|---|---|---|
| | Raw Material | Mol | Solvent/ Concentration | | | | | | | | |
| Example 6 | | | | | | | | | | | |
| 1 | Ti(OC$_4$H$_9$)$_4$ | 1 | Acetylacetone | 1 | — | 500 | 0.2 | Impossible to measure due to electro-conductive passage | | | |
| 2 | PbO | 1 | 18 wt % | 3 | — | 500 | 0.9 | 0.25 | 0.05 | 4 × 10$^{12}$ | 225 |
| 3 | | | | 20 | 400 | 600 | 3.8 | 0.06 | 0.05 | 4 × 10$^{12}$ | 250 |
| Example 7 | | | | | | | | | | | |
| 1 | Ti(OC$_4$H$_9$)$_4$ | 1 | Benzoylacetone | 1 | — | 500 | 0.15 | Impossible to measure due to electro-conductive passage | | | |
| 2 | Zr(OC$_4$H$_9$)$_4$ | 1 | 12.5 wt % | 5 | — | 500 | 0.6 | 1.00 | 0.05 | 4 × 10$^{12}$ | 678 |
| 3 | Pb(C$_2$H$_5$COO)$_2$ | 2 | | 20 | 400 | 600 | 2.0 | 0.30 | 0.05 | 4 × 10$^{12}$ | 680 |
| Example 8 | | | | | | | | | | | |
| 1 | Ti(OC$_4$H$_9$)$_4$ | 0.35 | Acetylacetone | 1 | 500 | 700 | 0.08 | Impossible to measure due to electro-conductive passage | | | |
| 2 | Zr(OC$_4$H$_9$)$_4$ | 0.65 | 10 wt % | 7 | 500 | 700 | 0.85 | 0.63 | 0.04 | 5 × 10$^{12}$ | 605 |
| 3 | La(C$_2$H$_5$COO)$_3$ | 0.095 | | 13 | 500 | 700 | 1.6 | 0.46 | 0.05 | 5 × 10$^{12}$ | 831 |
| 4 | PbO | 0.905 | | 20 | 500 | 700 | 2.6 | 0.26 | 0.04 | 5 × 10$^{12}$ | 763 |
| Example 9 | | | | | | | | | | | |
| 1 | Ti(OC$_4$H$_9$)$_4$ | 0.40 | Acetylacetone | 1 | 500 | 600 | 0.1 | Impossible to measure due to electro-conductive passage | | | |
| 2 | Zr(OC$_4$H$_9$)$_4$ | 0.60 | 10 wt % | 5 | 500 | 600 | 0.6 | 0.90 | 0.06 | 1 × 10$^{12}$ | 610 |
| 3 | PbO | 1.00 | | 10 | 500 | 600 | 1.1 | 0.51 | 0.05 | 1 × 10$^{12}$ | 630 |
| Example 10 | | | | | | | | | | | |
| 1 | Ti(OC$_4$H$_9$)$_4$ | 1 | Ethyl acetoacetate | 1 | 500 | 600 | 0.1 | Impossible to measure due to electro-conductive passage | | | |
| 2 | Zr(OC$_4$H$_9$)$_4$ | 1 | 10 wt % | 5 | 500 | 600 | 0.5 | 1.0 | 0.07 | 1 × 10$^{12}$ | 560 |
| 3 | PbO | 2 | | 10 | 500 | 600 | 1.0 | 0.53 | 0.06 | 1 × 10$^{12}$ | 600 |
| Comparative Examples | | | | | | | | | | | |
| 1 | same as Example 1 | | Methanol | 10 | — | 600 | 2.0 | Impossible to measure due to electro-conductive passage | | | |
| 2 | same as Example 2 | | Ethanol | 10 | — | 600 | 1.1 | Impossible to measure due to electro-conductive passage | | | |
| 3 | same as Example 3 | | Butanol | 20 | 500 | 750 | 2.8 | Impossible to measure due to electro-conductive passage | | | |
| 4 | same as Example 4 | | Ethanol | 20 | 500 | 750 | 2.5 | Impossible to measure due to electro-conductive passage | | | |
| 5 | same as Example 5 | | Butanol | 20 | 500 | 750 | 2.5 | Impossible to measure due to electro-conductive passage | | | |

(Note)
In Examples 6, 7, 9 and 10, platinum substrates were used and in Example 8, ITO film-coated pyrex substrate was used. In Comparative Examples, the same substrates as used in the corresponding Examples were employed.

USEFULNESS OF THE INVENTION

As shown in the aforsaid Examples, though the thin-film dielectrics of the present invnetion has an extremely thin-film of 0.1-100 μm, in total thickness they are electro-conductive passage-free, transparent, and have excellent dielectric characteristics.

Accordingly, they are useful as dielectric devices such as thin-film condensers, piezoelectric elements, pyroelectric elements etc. The dielectric characteristics of the thin-film dielectric of the invention are intimately related with the process for the production thereof, and hydrolytically stable metallic compound may be held and contained at a high concentration in said solution to make the operation for the preparation of the thin-film dielectric very easy. Another advantage in the present invention is that in the full-baking of the coated film of the precursor on the substrate, organic matters decompose very easily, and particularly, the hydroxyl radical which causes an electro-conductive passage does not readily remain on and in the thin-films.

This invention offers thin-film dielectrics with superior dielectric characteristics and exceedingly thin-layered films and their manufacturing processes, and the industrial significance is very large.

What is claimed is:

1. A thin-film dielectric comprising two or more layers of a thin-film of a dielectric formed on a substrate, wherein the composition of said dielectric consists of lead titanate zirconate containing third components represented by the formula $Pb(Ti_xZr_y)_s(M'_{\frac{1}{3}}M''_{\frac{2}{3}})_tO_3$ wherein,
M' is Mg and M" is Nb, or
M' is Ni and M" is Nb
z and y represent figures satisfying the following relations;
x is 0.3 to 0.55,
y is 0.45 to 0.7, and
x+y=1,
s and t represent figures satisfying the following relation;
s+t=1, and
t≦0.6.

2. A process for the production of a thin-film dielectric consisting of coating on a substrate a thin-film of a dielectric precursor acetylacetone solution of a compound selected from a group of reaction products between metallic compounds, represented by the following formulae (7), (8) and (9);

$$PbTiO_2(OR)_j(OCOR')_k \qquad (7)$$

(wherein, R and R' represent same or different monovalent hydrocarbon radical (s),
j and k represent figures satisfying a relation of j+k=2)

  (8)

(wherein,
M represents a mixture of Ti and Zr,
M' represents a divalent metal selected from a group consisting of Mg, Co, Fe, Cr, Zn, Mn, Ni and Cd,
M" represents Nb or Ta,
R and R' represent same or different monovalent hydrocarbon radical(s),
s and t represent figures satisgying the relations of s+t=1 and t≦0.6, and
j and k represent figures satisfying a relation of j+k=2)

$$Pb_{(1-z)}La_zM_{(1-(z/4))}O_2(OR)_j(OCOR')_k \qquad (9)$$

(wherein,
M represents a mixture of Ti and Zr,
R and R' represent same or different monovalent hydrocarbon radical(s),
z represents figures satisfying the relation of z≦0.2,
j and k represent figures satisfying a relation of (j+k=2) then drying the coating,
thereafter, pre-baking said thin-film of dielectric precursor at a temperature between the decomposing temperature of organic component of said presursor and the crystallizing temperature of the desired dielectric, then, repeating the cycle of coating said precursor solution and said drying of the coated film layer of said precursor and said pre-baking, and finally, full-baking the pre-baked coated film layers on the substrate at a temperature of the crystallizing temperature of the dielectric or higher;
or repeating the cycle of said coating of said precursor solution on the substrate and said drying to form the coated film layer of said precursor and full-baking of said thin-film of dielectric precursor at a temperature of the crystallizing temperature of the dielectric or higher.

* * * * *